United States Patent [19]
Early

[11] Patent Number: 6,117,597
[45] Date of Patent: Sep. 12, 2000

[54] EXTREME ULTRAVIOLET LITHOGRAPHY MASK BLANK AND MANUFACTURING METHOD THEREFOR

[75] Inventor: Kathleen R. Early, Santa Clara, Calif.

[73] Assignee: Advanced Micro Devices, Inc., Sunnyvale, Calif.

[21] Appl. No.: 09/392,230

[22] Filed: Sep. 8, 1999

Related U.S. Application Data

[62] Division of application No. 08/980,554, Dec. 1, 1997, Pat. No. 5,978,441.

[51] Int. Cl.[7] ........................................................ G03F 9/00
[52] U.S. Cl. .................................................. 430/5; 378/35
[58] Field of Search ............................. 430/5, 322, 323; 378/34, 35, 84, 85

[56] References Cited

U.S. PATENT DOCUMENTS 5,052,033  9/1991  Ikeda et al. ............................... 378/35
5,468,337  11/1995  Miyatake ................................... 216/24
5,485,499  1/1996  Pew et al. .................................. 378/84
5,514,499  5/1996  Iwamatsu et al. ........................... 430/5
5,757,883  5/1998  Haisma et al. ............................. 378/84
5,798,194  8/1998  Nakasuji et al. ............................ 430/5
5,935,739  8/1999  Bayer et al. ................................ 430/5
5,958,629  9/1999  Yan et al. ................................... 430/5

Primary Examiner—S. Rosasco
Attorney, Agent, or Firm—Mikio Ishimaru

[57] ABSTRACT

A reflective element for extreme ultraviolet semiconductor lithography systems substantially minimizes the phase transitions of reflected extreme ultraviolet light by a reflective multilayer coating on an extremely planar surface which is parallel to a family of (111) crystallographic planes of a single crystal silicon wafer. The extremely planar surface is made by using three of the families of (111) crystallographic planes of the single crystal silicon as etch barriers for anisotropic etchants.

10 Claims, 2 Drawing Sheets

EXTREME ULTRAVIOLET LITHOGRAPHY MASK BLANK AND MANUFACTURING METHOD THEREFOR

CROSS-REFERENCE TO RELATED APPLICATION(S)

This is a division of application Ser. No. 08/980,554 filed on Dec. 1, 1997 now U.S. Pat. No. 5,978,441.

TECHNICAL FIELD

The present invention relates generally to extreme ultraviolet lithography systems and more particularly to mask blanks therefor and a manufacturing method therefor.

BACKGROUND ART

Extreme ultraviolet lithography (also known as soft x-ray projection lithography) is a contender to replace deep ultraviolet lithography for the manufacture of 0.13 micron, and smaller, minimum feature size semiconductor devices.

However, extreme ultraviolet light, which is generally in the 7 to 40 nanometer wavelength range, is strongly absorbed in virtually all materials. For that reason, extreme ultraviolet systems work by reflection rather than by transmission of light. Through the use of a series of mirrors, or lens elements, and a reflective element, or mask blank, coated with a non-reflective absorber mask pattern, the patterned actinic light is reflected onto a resist-coated semiconductor wafer.

The lens elements and mask blanks of extreme ultraviolet lithography systems are coated with reflective multilayer coatings of materials such as molybdenum and silicon. Reflection values of approximately 65% per lens element, or mask blank, have been obtained by using substrates that are coated with multilayer coatings that strongly reflect light essentially at a single wavelength within a extremely narrow ultraviolet bandpass; e.g., 12 to 14 nanometer bandpass for 13 nanometer ultraviolet light.

There are various classes of defects in semiconductor processing technology which cause problems. Opaque defects are typically caused by particles on top of the multilayer coatings or mask pattern which absorb light when it should be reflected. Clear defects are typically caused by pinholes in the mask pattern on top of the multilayer coatings through which light is reflected when it should be absorbed. And phase defects are typically caused by scratches and surface variations beneath the multilayer coatings which cause transitions in the phase of the reflected light. These phase transitions result in light wave interference effects which distort or alter the pattern that is to be exposed in the resist on the surface of the semiconductor wafer. Because of the shorter wavelengths of radiation which must be used for sub-0.13 micron minimum feature size, scratches and surface variations which were insignificant before now become intolerable.

While progress has been made in reducing or eliminating particle defects and work has been done on repair of opaque and clear defects in masks, to date nothing has been done to address the problem of phase defects. For deep ultraviolet lithography, surfaces are processed to maintain phase transitions below 60°. Similar processing for extreme ultraviolet lithography is yet to be developed.

For an actinic wavelength of 13 nanometers, a 180° phase transition in the light reflected from the multilayer coating may occur for a scratch of as little as 3 nanometers in depth in the underlying surface. This depth gets shallower with shorter wavelengths. Similarly, at the same wavelength, surface variations more abrupt than one (1) nanometer rise over one hundred (100) nanometers run may cause similar phase transitions. These phase transitions can cause a phase defect at the surface of the semiconductor wafer and irreparably damage the semiconductor devices.

In the past, mask blanks for deep ultraviolet lithography have generally been of glass but silicon has been proposed as an alternative for extreme ultraviolet lithography. Whether the blank is of glass or silicon, the surface of the mask blank is made as smooth as possible by mechanical polishing with an abrasive. The scratches that are left behind in such a process are sometimes referred to as "scratch-dig" marks, and their depth and width depend upon the size of the particles in the abrasive used to polish the mask blank. For visible and deep ultraviolet lithography, these scratches are too small to cause phase defects in the pattern on the semiconductor wafer. However, for extreme ultraviolet lithography, scratch-dig marks are a significant problem because they will appear as phase defects.

DISCLOSURE OF THE INVENTION

The present invention provides a reflective element which substantially minimizes the phase transitions of extreme ultraviolet light reflected by a multilayer coating on a surface of a crystalline material which is parallel to a crystallographic plane of the crystalline material.

The present invention also provides a method for making extremely planar surfaces for extreme ultraviolet lithography mask blanks by utilizing three of the four (111) families of crystallographic planes of single crystal silicon as etch barriers for anisotropic etchants.

One advantage of the present invention is to provide a planar surface for mask blanks having reflective coatings which substantially minimizes the phase transitions of extreme ultraviolet light in semiconductor lithography systems.

Another advantage of the present invention is to provide a mask blank having no variation of its planar surface which would cause a phase defect in an extreme ultraviolet semiconductor lithography system.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
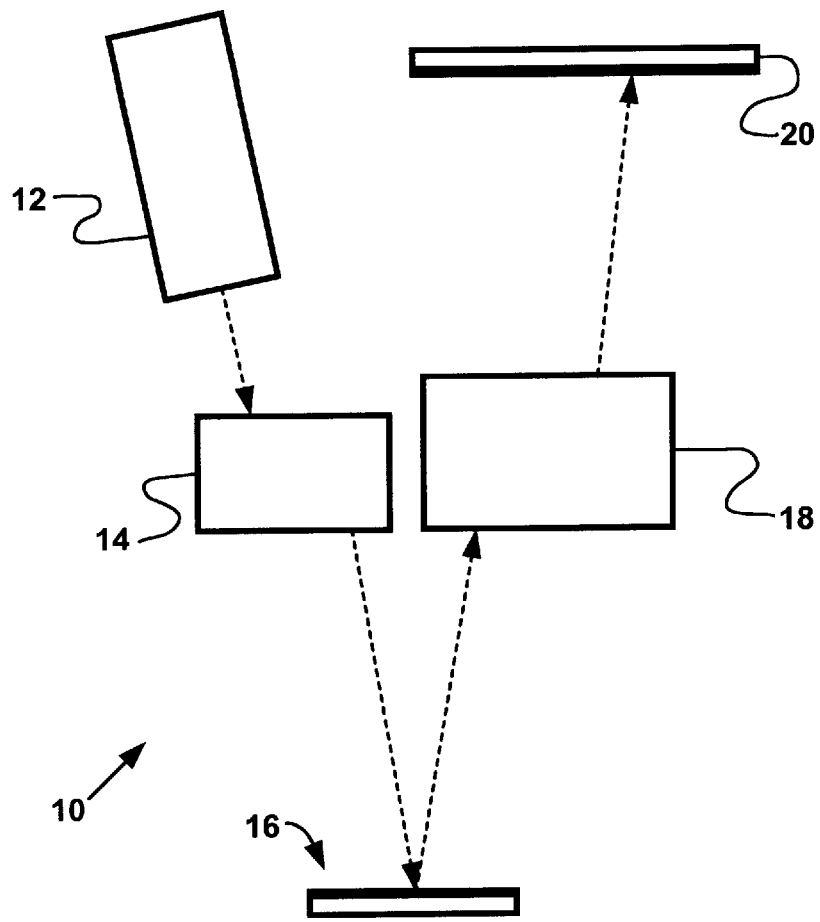
FIG. 1 is an overview of an extreme ultraviolet lithography system.

Referring now to FIG. 1, therein is shown an extreme ultraviolet lithography system 10. The system 10 contains a soft x-ray radiation source 12. The radiation is produced in a number of different ways, such as a laser-generated plasma generated by the interaction of laser light waves with xenon gas. The soft x-ray radiation is directed to a condenser lens unit 14.

Depending on the design, different wavelengths of radiation in the soft x-ray wavelength spectrum can be passed through the condenser lens unit 14. For an extreme ultraviolet lithography system, the radiation would be in the portion of the spectrum described as extreme ultraviolet light which ranges from forty (40) down to seven (7) nanometers wavelength.

The light from the condenser lens unit 14 is projected onto a pattern mask unit 16. A portion of the light is absorbed by the mask unit 16 and the remainder is reflected to a demagnifying, step and scan lens system 18.

The system 18 reduces the size of the image from the pattern mask unit 16 and then steps the reduced image to show up as multiple side by side images on a resist-coated semiconductor wafer 20. Finally, the system 18 scans the reduced and stepped image with the actinic extreme ultraviolet light to pattern the resist. The semiconductor wafer 20 is then processed and machined as well known to those skilled in the art to produce the final semiconductor devices (not shown).

Figure 2:
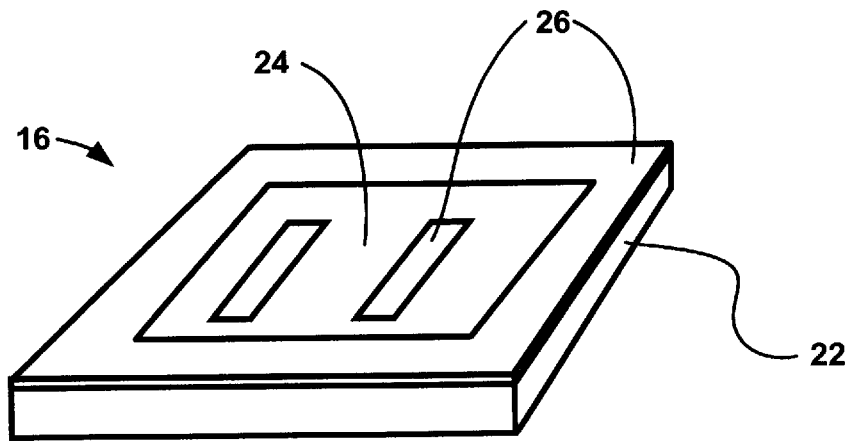
FIG. 2 is an isometric view of a machined mask blank of the present invention.

Referring now to FIG. 2, therein is shown an isometric view of a mask unit 16. The mask unit 16 consists of a mask blank 22 which is machined to be a generally square slice of highly polished, single crystal silicon. The mask blank 22 has provided on its top surface a reflective multilayer coating 24 of uniform thickness. The multilayer coating 24 generally consists of extremely thin alternate layers of two materials with different refractive indices where the indices are chosen to optimize reflection from the surfaces between the thin layers. One frequently used combination is that of molybdenum and silicon. On top of the multilayer coating 24 is a patterned coating 26. This patterned coating 26 is in the pattern of the image of the semiconductor device which is stepped and projected onto the resist on the semiconductor wafer 20.

Figure 3:
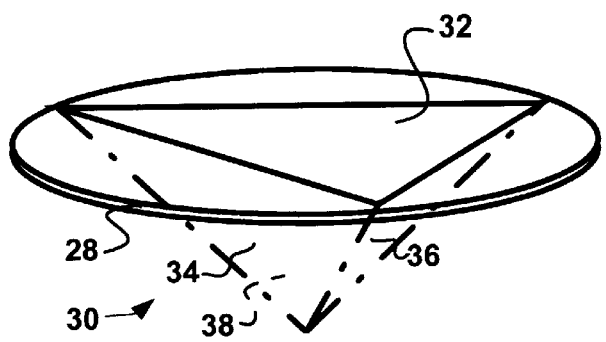
FIG. 3 is an isometric view of a mask blank silicon wafer with the crystallographic planes shown.

Referring now to FIG. 3, therein is shown a silicon wafer 28 which has been sliced from a single crystal silicon ingot (not shown). By way of background, all crystals have crystallographic structures which are defined by planes in an X-Y-Z coordinate system using what is called Miller notation. The planes are the boundaries of each facet of the crystal lattice down to the atomic level. The crystallographic structure of single crystal silicon has four families of (111) planes. The intersections of planes from all four of the (111) families form a pyramid with four facets, with each facet being an equilateral triangle.

The pyramidal crystallographic structure of the single silicon crystal is designated as 30 and is oriented with the equilateral triangle of one family of (111) planes 32 parallel to the surface of the silicon wafer 28. A family of (111) planes 34 and a family of (111) planes 36 are shown in FIG. 3 in front of a family of (111) planes 38.

Figure 4:
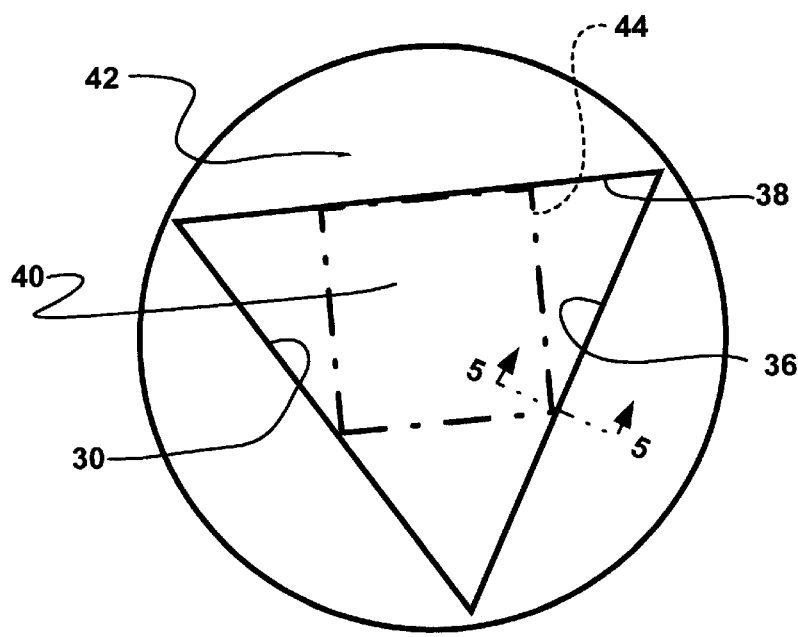
FIG. 4 is a top view of the silicon wafer showing the protective pattern and etched surface.

Referring now to FIG. 4, therein is shown a top view of the silicon wafer 30 showing the intersections of the families of (111) planes 34, 36, and 38 with an exposed surface 40 of the silicon wafer 30. The exposed surface 40 is one of the families of (111) planes of the family of planes 32. Bounding the exposed surface 40 is a crystal- or silicon-protective coating 42 which is shown as a circle with an equilateral triangle removed from the center. The protective coating 42 is a material which is resistant to the crystal- or silicon-attacking etchant which is used to etch the exposed surface 40.

Further, in FIG. 4 is shown a phantom outline of the mask blank surface area 44 which would be subsequently machined out of the silicon wafer 30 to form the mask blank 22. The exposed surface 40 of the square 44 would be the surface upon which the multilayer coating 24 (shown in FIG. 2) and the patterned coating 26 (also shown in FIG. 2) would be placed.

Figure 5:
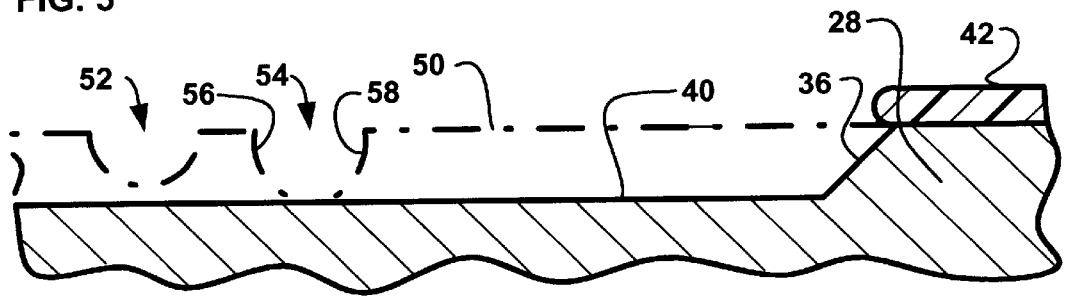
FIG. 5 is a cross-sectional view taken along 5—5 of FIG. 4.

Referring now to FIG. 5, therein is shown a partial section through 5—5 of FIG. 4. Shown on the silicon wafer 30 is the protective coating 42 on the wafer's original surface 50. The original surface 50 is polished by mechanical polishing using abrasives. The abrasives contain particles which leave a typical scratch-dig mark or imperfection 52 in the original surface 50. If the scratch-dig mark were not removed and the multilayer coating 24 were placed in and over the scratch-dig mark, the indentation in the multilayer coating 24 would be sufficient to cause a substantial phase transition in reflected extreme ultraviolet light.

The deepest imperfection, designated as imperfection 54, is shown with sidewalls 56 and 58 which are the surfaces attacked by an anisotropic etchant. The bottom of the imperfection 54 would be the deepest exposed surface 40. The anisotropic etchant would attack the imperfection 52 and the sidewalls 56 and 58 so much faster than the exposed surface 40 that the imperfections 52 and 54 would be eliminated, or reduced to a rise-overrun surface variation where no phase defect causing phase transition would appear.

During this etching, both the surface 40 and the surface 36 are exposed. The surface 36 is one of the family of (111) planes 36 so is designated by the same number. The same would be true for other surfaces 34 and 38.

In operation, the source 12 generates soft x-ray radiation which is directed through the condenser lens unit 14. Inside the condenser lens unit 14 are a series of reflecting lens elements which collect the radiation and reflect extreme ultraviolet light on the pattern mask unit 16. Currently, 13 nanometer light is being used but there have been discussions of using 7 nanometer and shorter wavelengths in the future.

In the pattern unit 16, the reflected multilayer coating 24 of molybdenum and silicon on the mask blank 22 will reflect approximately 65% of the extreme ultraviolet light projected onto areas which are not patterned, or masked. The reflected light will be within an extremely narrow extreme ultraviolet bandpass and essentially at a single wavelength. For example, for a bandpass of 12 to 14 nanometers, the wavelength would be 13 nanometers.

Phase transitions of 180° are subject to interference effects where the light waves cancel out totally. From around 80° to 180°, the interference effects increase so that less and less light falls where it should on the resist on the semiconductor wafer 20 in the area affected by the interference effect. This would alter or distort the pattern on the resist from the pattern on the mask blank 22. Thus, a defect would occur on the semiconductor wafer 20 which would cause a defect on the final semiconductor devices. To avoid defective semiconductor devices, the phase transitions should be minimized and, if possible, kept under 60°.

Since extreme ultraviolet lithography depends on extremely short wavelengths of light, it is necessary for the minimization of the phase transitions of light reflected from the multilayer coating 24 that the surface of the multilayer coating 24 be planar to within a fraction of the wavelength. This means the surface of the mask blank 22 also must be extremely planar.

For 40 nanometer light, a scratch as shallow as ten (10) nanometers would cause an irregularity in its surface covering the scratch which will cause interference effects to come into play while a three (3) nanometer scratch would be at the borderline of causing a phase defect. When the system 10 is using light in the 13 nanometer wavelength, a scratch as shallow as three (3) nanometers in depth will cause a phase defect while one (1) nanometer would again be on the borderline.

Similarly, for 40 nanometer light, if there is a surface variation more abrupt than a one (1) nanometer rise over a thirty (30) nanometers, it would cause a phase transition which would cause the same interference effects. For 13 nanometer light, a surface variation greater than about one (1) nanometer rise over one hundred (100) nanometers might cause problems.

When the mask blank has sufficient surface planarity, i.e., is lacking in scratches and is lacking in surface height variations, the reflective multilayer coating 24 will minimize the unwanted phase transitions of the reflected extreme ultraviolet light to avoid phase defects in the final semiconductor devices. In the ideal situation, the surface 40 would have a surface planarity totally parallel to the (111) crystallographic plane 32 at the atomic level. However, some ultra-small scratches or gentle undulations of the surface 40 from the ideal would be tolerable and would not cause phase defects.

For determining if the surface planarity of the surface 40 substantially minimizes the phase transitions of extreme ultraviolet light reflected from the multilayer coating 24, one test is that no phase defects appear on the semiconductor wafer or on the semiconductor devices being processed by the system 10.

The mask blank 22 also has the pattern coating 26 which is on top of the reflective multilayer coating 24 which absorbs undesired extreme ultraviolet light to be the mask of the final semiconductor device.

The reflected light from the pattern mask unit 16 is then reflected to the demagnifying, step and scan lens system 18 which is also a reflective system. As previously explained, the system 18 reduces the size of the image of the reflected light and then moves each image from place to place on the semiconductor wafer 20 to allow the extreme ultraviolet light to be projected on the resist coating the semiconductor wafer 20. The processing of the semiconductor wafer 20 is then completed as well known to those skilled in the art.

In manufacturing the pattern mask unit 16 for an extreme ultraviolet lithography system 10, the starting point is the sliced single crystal silicon wafer 30. The silicon wafer 30 is coated with a protective coating 42 which will not be attacked, or will be attacked very slowly, by the etchant used to attack the original surface 50. Examples of the protective coating are silicon nitride ($Si_3N_4$) and silicon dioxide ($SiO_2$).

The pattern of the protective coating 42 in the best mode is shown as a circle with a removed equilateral triangle having sides which lie substantially parallel to and overlapping the three families of (111) planes/surfaces 34, 36, and 38. It should be noted that the protective coating 42 does not have to be an equilateral triangle, but merely needs to be an opening which extends to the family of (111) planes which will define the equilateral triangle of the desired size.

The size of the silicon wafer 30 that is needed and the size of the equilateral triangle that is patterned in the protective coating 42 will depend upon the size of the mask blank 22 that is required. The square or rectangular mask blank surface area 44 will need to be entirely contained within the equilateral triangle. For example, to obtain a 6-inch mask blank 22 would require a starting wafer diameter of approximately 15 inches.

It should be noted that since the perimeter of the mask units 16 has margins to absorb extraneous light and are not used, it is possible that starting silicon wafer 30 could be smaller than indicated above. Further, the alignment of the patterned protective coating does not have to be exact since misalignment and edge roughness of the patterned protective coating 42 would merely result in a larger equilateral triangle in the final etched silicon wafer 30.

After the protective coating 42 is patterned, the next step would be to etch the protective coating 42 to expose the original surface 50 using an etchant which attacks the protective coating. For a protective coating of silicon nitride the etchant could be phosphoric acid and for silicon dioxide would be hydrogen fluoride or buffered hydrogen fluoride. In addition to these wet-etching processes, plasma etching could also be used to attack the protective coating.

The patterned wafer is then placed in an anisotropic etchant. A few of the well-known anisotropic etchants for silicon are: hydrazine ($N_2H_4$) mixed with water; ethylenediamine pyrocatechol (EDP); and aqueous solutions of potassium or sodium hydroxide (KOH or NaOH). These anisotropic etchants have the characteristic that they etch the family of (111) planes much more slowly than any other crystallographic orientation. As a result of this characteristic, families of (111) planes 32, 34, 36, and 38 will not be etched or will etch only very slowly.

As shown in FIG. 5, the anisotropic etchant will attack the walls of the scratch 52 and cause the walls to etch away, moving toward the boundary family of (111) planes just under the protective coating 42. The sidewalls 56 and 58 will be etched away very quickly until the families of (111) planes/surfaces 34, 36, 38 are reached by the etchant. The etchant will attack the sidewalls 56 and 58 up to one hundred times faster than the exposed families of (111) surfaces 34, 36, and 38. This will leave an extremely planar exposed surface 40 without the surface imperfection 52.

The degree of planarity is a function of the selectivity of the anisotropic etchant. A selectivity of 1:50 means the sidewalls 56 and 58 will etch fifty times more rapidly than the (111) planes/surfaces. Greater selectivity anisotropic etchants, some commonly known to have selectivities of 1:100, which are used in the best mode, provide the planarity of one nanometer rise over one hundred nanometer run. Even greater selectivity anisotropic etchants would provide even more planar surfaces.

The silicon wafer 30 is cleaned and, if necessary, the protective coating 42 is removed using the protective coating etchants which attack the protective coating 42.

Finally, the silicon wafer would be machined to obtain the square or rectangular mask blank 22. It should be noted, however, that there is no reason that the whole silicon wafer itself could not be used as the mask blank with the multilayer coating 24 thereon.

The mask blank 22 is coated with the multilayer coating 24 that reflects at the wavelength of choice. And, subsequently, the patterned coating 26 can be laid down on top of the multilayer coating 24.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims in all matters set forth herein or shown in the accompanying drawings are to be interpreted in an illustrative and not a limiting sense.

The invention claimed is:

1. A method for making a reflective element for a semiconductor lithography system comprising the steps of:

coating a crystalline material having families of (111) planes intersecting with and enclosing a portion of a surface of said crystalline material with crystal-etch-resistant protective coating; and etching said enclosed portion of said surface of said crystalline material with an anisotropic crystal-attacking etchant under said crystal etch-resistant protective coating.

2. The method as claimed in claim 1 including the step of:

machining said crystalline material into a mask blank;

coating with a reflective coating; and coating said reflective coating with a patterned non-reflective coating.

3. The method as claimed in claim 1 including the steps of:

patterning said protective coating with an equilateral triangle similar to an equilateral triangle formed by three families of (111) crystallographic planes of said crystalline material intersecting said protective coating;

etching with a patterned-protective-coating-attacking etchant after patterning said protective coating; and etching with a protective-coating-attacking etchant to remove said protective coating before cleaning.

4. The method as claimed in claim 1 including the step of coating said crystalline material with a multilayer reflective coating.

5. The method as claimed in claim 4 including the step of coating said multilayer reflective coating with a patterned coating.

6. A method of making a mask blank comprising the steps of:

coating a single crystal silicon wafer having families of (111) planes intersecting with and enclosing a portion of a surface of said single crystal silicon wafer with a silicon-etchant-resistant protective coating;

patterning a portion of said protective coating to be non-silicon-etchant etch removable;

etching said protective coating with said non-silicon-etchant etch to expose a portion of said silicon wafer;

etching said portion of said exposed silicon wafer with an anisotropic silicon-etchant; and cleaning said silicon wafer.

7. The method as claimed in claim 6 including the step of patterning said protective coating with an equilateral triangle similar to an equilateral triangle formed by three families of (111) crystallographic planes of said silicon wafer intersecting said protective coating.

8. The method as claimed in claim 6 including the step of etching to remove said protective coating before cleaning.

9. The method as claimed in claim 6 including the step of coating with a multilayer reflective coating.

10. The method as claimed in claim 9 including the steps of:

machining said silicon wafer to the shape of a mask blank; and coating said multilayer reflective coating with a patterned coating.

* * * * *